United States Patent
Takami et al.

(10) Patent No.: US 7,847,214 B2
(45) Date of Patent: Dec. 7, 2010

(54) LASER CRYSTALLIZATION APPARATUS AND CRYSTALLIZATION METHOD

(75) Inventors: Yoshio Takami, Yokohama (JP); Tatsuhiro Taguchi, Kyoto (JP)

(73) Assignee: Advanced LCD Technologies Development Center Co., Ltd., Kawasaki-shi (JP)

(*) Notice: Subject to any disclaimer, the term of this patent is extended or adjusted under 35 U.S.C. 154(b) by 653 days.

(21) Appl. No.: 11/567,383

(22) Filed: Dec. 6, 2006

(65) Prior Publication Data
US 2008/0073573 A1    Mar. 27, 2008

(30) Foreign Application Priority Data
Dec. 15, 2005    (JP) .............................. 2005-362092

(51) Int. Cl.
*B23K 26/00* (2006.01)
(52) U.S. Cl. .............................. 219/121.65; 219/121.63; 219/121.62
(58) Field of Classification Search ............ 219/121.62, 219/121.65, 121.63; 250/492.2
See application file for complete search history.

(56) References Cited

U.S. PATENT DOCUMENTS

| | | | |
|---|---|---|---|
| 6,346,687 B1* | 2/2002 | Kinoshita et al. | 219/121.62 |
| 6,797,550 B2* | 9/2004 | Kokubo et al. | 438/164 |
| 6,835,426 B2* | 12/2004 | Duignan et al. | 427/596 |
| 7,172,841 B2 | 2/2007 | Taniguchi et al. | |
| 7,232,982 B2* | 6/2007 | Takami | 250/208.1 |
| 7,410,848 B2* | 8/2008 | Jyumonji et al. | 438/166 |
| 7,427,764 B2* | 9/2008 | Takami | 250/492.2 |
| 7,642,482 B2* | 1/2010 | Takami et al. | 219/121.65 |
| 2003/0128350 A1 | 7/2003 | Tanaka | |
| 2003/0216012 A1* | 11/2003 | Sasaki et al. | 438/487 |
| 2004/0097103 A1* | 5/2004 | Imai et al. | 438/795 |
| 2004/0266080 A1* | 12/2004 | Jyumonji et al. | 438/166 |
| 2005/0040146 A1* | 2/2005 | Takami | 219/121.63 |
| 2006/0019503 A1* | 1/2006 | Takami | 438/795 |

(Continued)

FOREIGN PATENT DOCUMENTS

JP    2003-197521    7/2003

(Continued)

OTHER PUBLICATIONS

"Automation Solutions for Laser Processing, Medical Device Manufacturing, and Life Sciences", 2003, Aerotech, p. 9.*

(Continued)

*Primary Examiner*—Laura M Menz
(74) *Attorney, Agent, or Firm*—Oblon, Spivak, McClelland, Maier & Neustadt, L.L.P.

(57) ABSTRACT

A laser crystallization apparatus and a crystallization method with a high throughput are provided. Laser light having a predetermined light intensity distribution is irradiated to a semiconductor film to melt and crystallize, wherein an irradiation position is placed very quickly and with a high positional accuracy, thereby forming the semiconductor film having a large crystal grain size. A laser crystallization apparatus according to one aspect of the present invention comprises a crystallizing laser light source, a phase shifter modulating pulse laser light to have the predetermined light intensity distribution, an excimer imaging optical system, a substrate holding stage mounting a processing substrate and continuously moving in the predetermined direction, a position measuring means, and a signal generating means indicating generation of the pulse laser light based on the position measurement of the stage by the position measuring means.

19 Claims, 8 Drawing Sheets

U.S. PATENT DOCUMENTS

| | | |
|---|---|---|
| 2006/0186412 A1* | 8/2006 | Jyumonji et al. ............... 257/66 |
| 2007/0138146 A1* | 6/2007 | Takami et al. ............ 219/121.6 |
| 2008/0073573 A1* | 3/2008 | Takami et al. ............ 250/492.2 |
| 2008/0289573 A1* | 11/2008 | Jyumonji et al. ............ 118/641 |
| 2009/0004763 A1* | 1/2009 | Ono et al. ...................... 438/7 |
| 2009/0017642 A1* | 1/2009 | Takami ...................... 438/795 |

FOREIGN PATENT DOCUMENTS

| | | |
|---|---|---|
| JP | 2003-218058 | 7/2003 |
| JP | 2005-64079 | 3/2005 |
| WO | WO 01/71791 A1 | 9/2001 |

OTHER PUBLICATIONS

"ABL1000 Series", archived Apr. 2004, Aerotech [retrieved on Jan. 27, 2010]. Retrived from: Internet Archive (wayback machine) <url: http://web.archive.org/web/20040407100757/www.aerotech.com/products/pdf/abl1000.pdf>.*

Kohki Inoue, et al., "Amplitude and Phase Modulated Excimer-Laser Melt-Regrowth Method of Silicon Thin-Films—A New Growth Method of 2-D Position-Controlled Large-Grains-", Thesis Journal of Institute of Electronics, Information and Communication Engineers, Aug. 2002, vol. J85-C, No. 8, pp. 624-629.

* cited by examiner

LASER CRYSTALLIZATION APPARATUS AND CRYSTALLIZATION METHOD

CROSS-REFERENCE TO RELATED APPLICATIONS

This application is based upon and claims the benefit of priority from prior Japanese Patent Application No. 2005-362092, filed Dec. 15, 2005, the entire contents of which are incorporated herein by reference.

BACKGROUND OF THE INVENTION

1. Field of the Invention

The present invention relates to a laser crystallization apparatus and a crystallization method, and more specifically, to a laser crystallization apparatus and a crystallization method in which positioning is performed very quickly and with a high positional accuracy to irradiate laser light for crystallization.

2. Description of the Related Art

A thin film transistor (TFT) formed on a semiconductor film, for example, a silicon film, provided on a large-area substrate, for example, a glass substrate, is used as, for example, a switching device for switched display in an active matrix type liquid crystal display device.

For the crystallization of a non-single crystal semiconductor thin film such as an amorphous or polycrystal semiconductor thin film used to form the thin film transistor, for example, a laser crystallization technique is used, wherein a short-pulse laser light with high energy is used to melt and crystallize an irradiated area of the non-single crystal semiconductor thin film.

Laser crystallization apparatuses presently serving in production employ a method in which crystallizing laser light with a uniform intensity distribution is irradiated to an amorphous silicon film. However, according to the method, the crystal grain size in a crystallized semiconductor film is as small as 0.5 µm or less, and position of the crystallized grains can not be controlled. Therefore, a crystal grain boundary could be present in a channel region of the TFT, so that there is a limitation in performance of the TFT, for example, uneven characteristics.

There has been a demand for a technique to manufacture a high-quality semiconductor film having large crystal grains, in order to improve the performance of the TFT. As a crystallization method satisfying this demand, among various laser crystallization techniques, an attention is particularly focused on phase modulated excimer laser annealing (PMELA) in which excimer laser light having a light intensity distribution in an inverse peak pattern shape generated by phase modulation is irradiated to the non-single crystal semiconductor thin film, thereby crystallizing the same. The PMELA technique is a method in which excimer laser light having a predetermined light intensity distribution is irradiated to the non-single crystal semiconductor thin film so that an irradiated portion of the semiconductor film is melted and crystallized. The excimer laser light having the predetermined light intensity distribution can be obtained by the phase modulation of incident laser light using a phase modulating element, for example, a phase shifter. The non-single crystal semiconductor thin film is, for example, a thin film of amorphous silicon or polycrystal silicon formed on a glass substrate. In the currently developed PMELA technique, an area sized at about several millimeters square is melted and crystallized by one laser irradiation. Owing to the crystallization of the non-single crystal semiconductor thin film, a crystallized silicon thin film with good quality is formed in which crystal grains are sized at several µm to about 10 µm and relatively uniform in size (e.g., refer to "Amplitude and Phase Modulated Excimer-Laser Melt-Regrowth Method of Silicon Thin-Film—A New Growth Method of 2-D Position Controlled Large-Grains—", published by Kohki Inoue, Mitsuru Nakata and Masakiyo Matsumura in a thesis journal of Institute of Electronics, Information and Communication Engineers, Vol. J85-C, No. 8, pp. 624-629, 2002). It has been proved that the TFT manufactured in the crystallized silicon thin film formed by this technique has stable electric properties.

In crystallization apparatuses of a conventional method, crystallizing laser light irradiates the semiconductor film in a shape of a long rectangle beam (e.g., 500 µm×300 mm) and with a uniform light intensity distribution. Thus, it is technically impossible to position a place where crystal grains are to be formed, and the crystal grain size in the crystallized semiconductor film is as small as 0.5 µm or less. Therefore, it is not required to absolutely positioning the irradiation position of the crystallizing laser light.

On the other hand, the PMELA crystallization technique is presently under development, wherein crystallizing laser light having an inverse-peak-shaped beam profile is generated by using the phase shifter or a diffracting optical element, and irradiated to the non-single crystal semiconductor film. The PMELA crystallization technique has good characteristics such that efficiency of crystallizing laser light used is high, crystals with large grain sizes can be obtained and the positioning of grown crystal grains is possible. However, a so-called step-and-repeat irradiation method is employed to crystallize a semiconductor film with a large area. That is, the following is repeated: after one irradiation of the laser light to the non-single crystal semiconductor film, the glass substrate is moved to and stopped at the next irradiation position, and then the laser light is irradiated again. Thus, there is a challenge to further improve throughput so that the PMELA crystallization technique becomes a mass-production technique. The present applicant has been developing a technique to industrialize the PMELA crystallization technique, and is developing a crystallization method with a higher throughput.

There are the following requirements to put the PMELA technique having the excellent characteristics as described above into practical use as an apparatus for producing, e. g., liquid crystal panels: positioning and forming crystal grains with an absolute positional accuracy on a micrometer order to form the main part of the TFT; and irradiating the crystallizing laser light so that the positioning and formation of the crystal grains can be repeatedly reproduced very quickly.

It is one of the object of the present invention to provide a laser crystallization apparatus and a crystallization method with a high throughput capable of forming a semiconductor film having a crystallized area with a large crystal grain size at a predetermined position on a continuously moving processing substrate, i.e., a substrate to be processed moving at a high velocity, by irradiating pulse laser light having a predetermined light intensity distribution to the processing substrate to melt and crystallize the semiconductor film.

BRIEF SUMMARY OF THE INVENTION

The above-mentioned problems are solved by a laser crystallization apparatus and a crystallization method according to the present invention below.

According to one aspect of the present invention, it is provided a laser crystallization apparatus comprising: a laser light source which generates pulse laser light on the basis of an input of a laser light generation indicating signal; and a phase shifter which is provided on an optical path of the laser light and which modulates the pulse laser light to transmit the pulse laser light having a predetermined light intensity distribution, wherein the pulse laser light modulated by the phase shifter is irradiated to a crystallizing thin film provided on a processing substrate to melt and crystallize an irradiated area of the crystallizing thin film, the laser crystallization apparatus comprising: a substrate holding stage which mounts the processing substrate and which continuously moves in a predetermined direction related to pulse laser light irradiating positions; position measuring means which measures a position of the substrate holding stage continuously moving in the predetermined direction; and signal generating means which indicates the generation of the pulse laser light on the basis of the position of the substrate holding stage measured by the position measuring means.

According to another aspect of the present invention, it is provided, in the laser crystallization apparatus, the substrate holding stage includes a first control system adjusting a laser light irradiation position in an X direction, a second control system adjusting the laser light irradiation position in a Y direction, and/or a third control system adjusting a height of the laser light irradiation position in a Z direction to a focal plane of the laser light.

According to another aspect of the present invention, it is provided a laser crystallization apparatus comprising: a plurality of laser light sources which generate pulse laser lights on the basis of an input of a laser light generation indicating signal; and a plurality of phase shifters which are provided on optical paths of the respective laser lights and which modulate the pulse laser lights to transmit the pulse laser lights having a predetermined light intensity distribution, wherein the plurality of pulse laser lights modulated by the phase shifters are irradiated to a thin film provided on a processing substrate to melt and crystallize irradiated areas of the thin film, the laser crystallization apparatus comprising: a substrate holding stage which mounts the processing substrate and which continuously moves in a predetermined direction related to pulse laser light irradiating positions; position measuring means which measures a position of the substrate holding stage continuously moving in the predetermined direction; and signal generating means which indicates the generation of the pulse laser light on the basis of the position of the substrate holding stage measured by the position measuring means.

According to another aspect of the present invention, it is provided, in the laser crystallization apparatus, the plurality of laser light sources are arranged to simultaneously irradiate the pulse laser lights to different positions on the thin film disposed in a second direction perpendicular to the direction of the continuous movement.

According to another aspect of the present invention, it is provided, in the laser crystallization apparatus, the pulse laser lights generated by the plurality of laser light sources are arranged to be irradiated to different positions on the thin film in the direction of the continuous movement.

According to another aspect of the present invention, it is provided, in the laser crystallization apparatus, the laser light source generates the pulse laser light synchronously with input of the laser light generation indicating signal.

According to another aspect of the present invention, it is provided, a laser crystallization method comprising: continuously moving a substrate holding stage mounted a processing substrate thereon in a predetermined direction; measuring a predetermined position on the continuously moving substrate holding stage; outputting a laser light generation indicating signal which indicates generation of laser light on the basis of the measured position information; generating pulse laser light on receipt of the laser light generation indicating signal; modulating the pulse laser light; and irradiating the modulated pulse laser light on the processing substrate to melt and crystallize an irradiated area of a crystallization thin film provided on the processing substrate.

According to another aspect of the present invention, it is provided, in the laser crystallization method, the pulse laser light irradiating the processing substrate has a plurality of pulse laser light paths, and irradiates different areas of the processing substrate.

According to another aspect of the present invention, it is provided, in the laser crystallization method, the measuring the predetermined position on the continuously moving substrate holding stage includes aligning the measured position with a predetermined crystallizing position in X direction and Y direction, and/or aligning the measured position in Z direction with a focal plane of the pulse laser light.

According to another aspect of the present invention, it is provided, in the laser crystallization method, the generating the pulse laser light includes generating the pulse laser light synchronously with an input of the laser light generation indicating signal.

Additional advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE SEVERAL
VIEWS OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
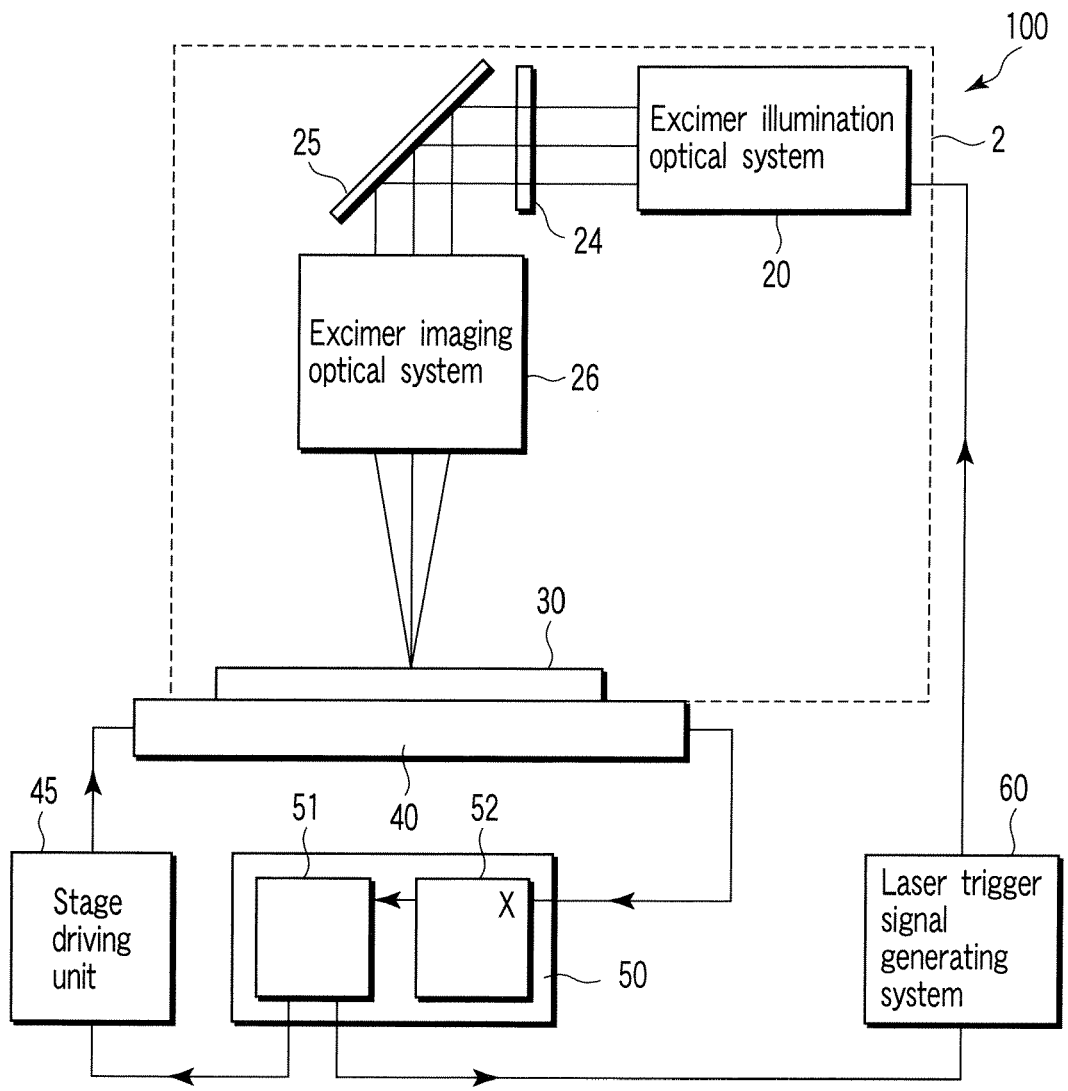
FIG. 1 is a diagram showing one example of a laser crystallization apparatus according to a first embodiment of the present invention.

The present invention provides a laser crystallization apparatus and a crystallization method which achieve high positioning accuracy and a high throughput and which uses a phase modulating element (hereinafter referred to as a phase shifter) to give a desired light intensity distribution to crystallizing laser light so that a high-quality crystallized semiconductor film is formed.

In this specification, the high throughput means that a crystallization area is formed at a predetermined position on a processing substrate while a substrate holding stage is continuously moving in one direction, for example, in X direction without stopping. The continuous movement means moving in one direction without changing a moving velocity. A crystallizing laser light irradiation position in a predetermined direction of the substrate holding stage or the processing substrate means a predetermined crystallization area or a crystallizing laser light irradiation position for crystallization. Measuring the crystallizing laser light irradiation position means detecting a predetermined position on the substrate holding stage or the processing substrate in a predetermined direction by position measuring means.

Higher quality is achieved by increasing the accuracy of the position at which the crystallizing laser light is being irradiated. Specifically, the crystallizing laser light irradiation position is decided while a measurement is being made to the position on continuously moving substrate holding stage in real time, such that the crystallizing laser light is irradiated to the processing substrate. For example, it is assumed that a time from the decision of the irradiation position to the generation of a trigger signal of the crystallizing laser light is 1 μsec or less, and a time from the input of the laser trigger signal to the laser light source to the irradiation of the crystallizing laser light is 1 μsec or less. A total delay time in this case is 2 μsec or less, thus the crystallizing laser light can be irradiated to the processing substrate with high positional accuracy.

Therefore, it can be provided a laser crystallization apparatus and a crystallization method with a high throughput capable of forming a semiconductor film having a crystallized area with a large crystal grain size at a predetermined position on the continuously moving processing substrate.

The embodiments of the present invention will be described with reference to the accompanying drawings. The accompanying drawings, which are incorporated in and constitute a part of the specification, illustrate embodiments of the invention, and together with the general description given above and the detailed description of the embodiments given below, serve to explain principles of the invention. Throughout the drawings, corresponding portions are denoted by corresponding reference numerals. The embodiments are only examples, and various changes and modifications can be made without departing from the scope and spirit of the invention.

First Embodiment

One example of a laser crystallization apparatus 100 according to a first embodiment of the present invention is shown in FIG. 1. The laser crystallization apparatus 100 comprises a crystallization optical system 2, a substrate holding stage 40, a stage position measuring system 50, and a system which generates a signal for indicating the generation of crystallizing laser light, for example, a laser trigger signal generating system 60. The substrate holding stage 40 is continuously moved at a predetermined velocity without stopping during a crystallization process period. The laser crystallization apparatus 100 irradiates crystallizing laser light to a predetermined position on a processing substrate 30 based on measurement of the predetermined position on the substrate holding stage by the stage position measuring system 50.

Figure 3:
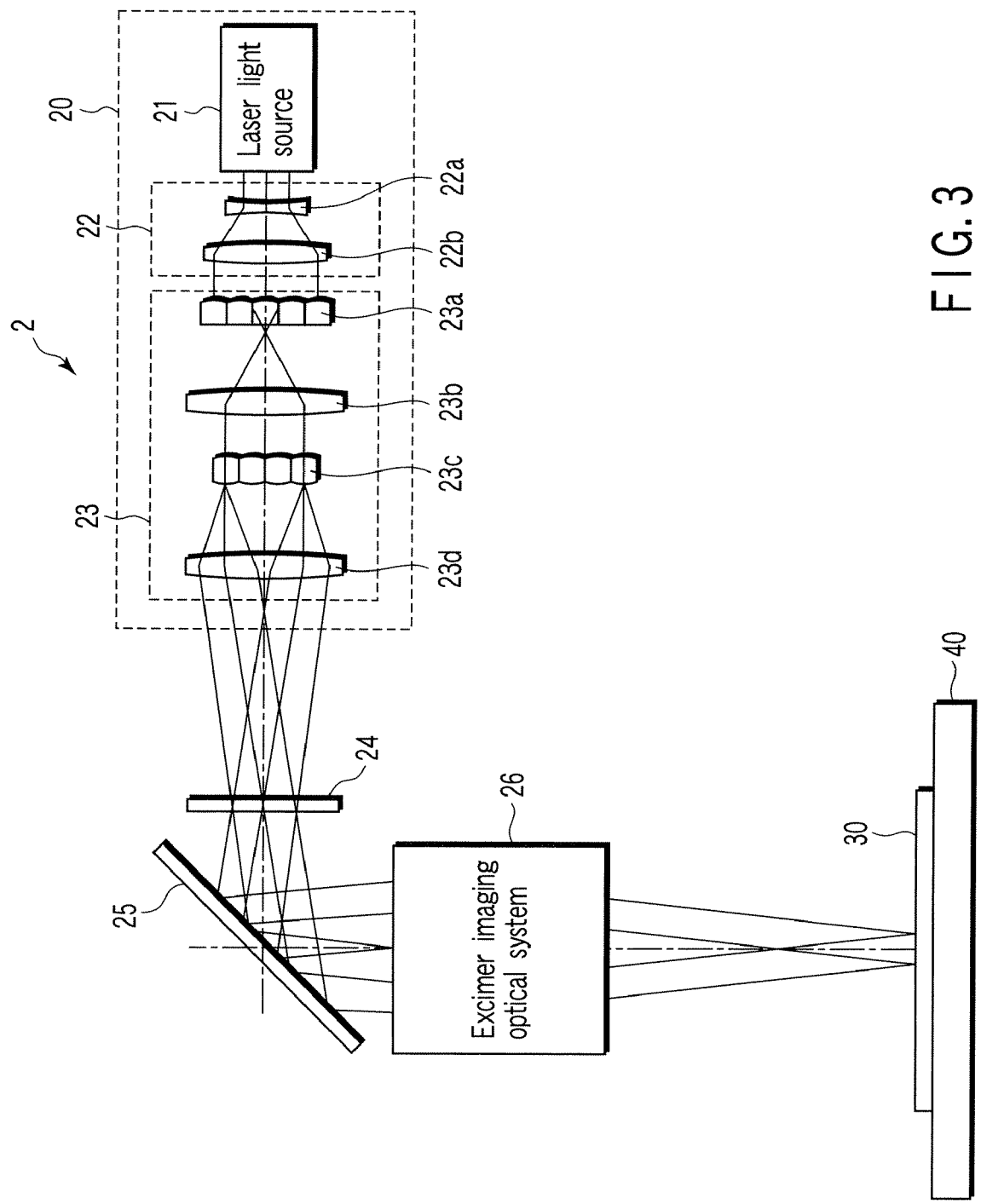
FIG. 3 is a diagram showing one example of the main parts of a crystallization optical system using a phase shifter and used in the laser crystallization apparatus shown in FIG. 1.

The crystallization optical system 2 comprises a light source, for example, an excimer illumination optical system 20, and a sequential arrangement of a phase shifter 24, a reflecting mirror 25, and an excimer imaging optical system 26 disposed on an outgoing optical path of the optical system 20. The excimer illumination optical system 20 is an optical system, which emits and adjusts the crystallizing laser light for illuminating the phase shifter 24 as shown in FIG. 3. The excimer illumination optical system 20 comprises an excimer laser light source 21 for generating pulse laser light in response to the input of the laser light generation indicating signal, and a homogenizer 23 for forming the pulse laser light into a light flux having a uniform light intensity distribution.

The laser light emitted from the excimer illumination optical system 20 and having the homogenized light intensity distribution irradiates the phase shifter 24. The phase shifter 24 is an optical element which phase-modulates the irradiated laser light and transmits crystallizing laser light having a predetermined light intensity distribution, for example, an inverse peak shape, suitable for lateral crystal growth. The reflecting mirror 25 is an optical component provided to change the optical path of the laser light transmitted through the phase shifter 24 into a direction to the processing substrate 30 (downward direction in FIG. 1), and is a total reflecting mirror.

The excimer imaging optical system 26 is an optical system for imaging the crystallizing laser light phase-modulated by the phase shifter 24 onto the processing substrate 30, and irradiating a non-single crystal semiconductor thin film 33 (see FIG. 2) provided on the processing substrate 30. The excimer imaging optical system 26 is an optical system for forming a transmitted light image of the phase shifter 24 onto the non-single crystal semiconductor thin film 33.

In FIG. 1, the crystallization optical system 2 is shown in a projection type in which the phase shifter 24 is disposed between the excimer illumination optical system 20 and the excimer imaging optical system 26. Another crystallization optical system 2 that can be employed is a proximity type in which the phase shifter 24 is disposed in proximity to the processing substrate 30.

The substrate holding stage 40 is a stage which detachably mounts the processing substrate 30 and which has a mechanism movable in X, Y and Z directions owing to a stage driving unit 45. The substrate holding stage 40 can comprise, as necessary, an α or β adjusting function for angle adjustment which rotates on an X axis or Y axis, and γ adjusting function which rotates on a Z axis. A high positional accuracy and good reproducibility are required for the movement of the substrate holding stage 40, and the substrate holding stage 40 is moved by, for example, a combination of an air bearing and a linear motor driving mechanism. A moving velocity in the X direction is, for example, 500 mm/sec.

The stage position measuring system 50 in the present embodiment is configured to highly accurately measure a predetermined position on the substrate holding stage 40 or processing substrate 30 which is continuously moving. The stage position measuring system 50 comprises a stage position control unit 51 and an X-direction position measuring unit 52. An output signal of the stage position measuring system 50 is supplied to the stage driving unit 45 and the laser trigger signal generating system 60.

The X-direction position measuring unit 52 can measure the moving distance of the substrate holding stage 40 in the X direction by counting pulse signals at a high speed and with a high positional accuracy of an order of several ten nm by use of, for example, a laser interferometer or a linear scale, thereby measuring the stage position.

A measured result from the X-direction position measuring unit 52 is sent to the stage position control unit 51. The stage position control unit 51 sends this positional information to the stage driving unit 45 and has a servomechanism for feedback-controlling the moving velocity of the substrate holding stage 40 within a predetermined positional accuracy on the basis of the positional information. The positional information in the X direction is also sent to the laser trigger signal generating system 60.

The laser trigger signal generating system 60 generates a trigger signal for indicating the generation of the crystallizing laser light when the substrate holding stage 40 is moved to a predetermined position in the X direction. A delay time from arriving the substrate holding stage 40 at the predetermined position to generating the trigger signal for emitting the crystallizing laser light is, for example, 1 μsec or less. In other words, the trigger signal indicating an emission of the crystallizing laser light is input to the excimer laser light source in the excimer illumination optical system 20 with a delay time of 1 μsec or less. The excimer laser light source which has received the trigger signal emits pulse laser light.

Figure 2:
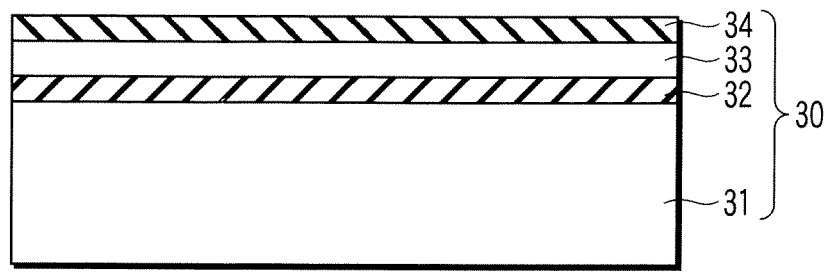
FIG. 2 is a sectional view shown to explain one example of the structure of a processing substrate to be crystallized by the laser crystallization apparatus.

The processing substrate 30 is detachably mounted to a predetermined position on the substrate holding stage 40 by, for example, vacuum suction. The processing substrate 30 is, for example, a large-area substrate of 550 mm×650 mm. A structure of the processing substrate 30 to be subjected to the crystallization is generally as shown in FIG. 2, wherein the non-single crystal semiconductor film 33 on an insulating film 32 is formed on a support substrate 31, and an insulating film 34 is provided as a cap film on the semiconductor film 33. The non-single crystal semiconductor film 33 is, for example, an amorphous silicon film, a polycrystal silicon film, a sputtered silicon film, a silicon germanium film or a dehydrogenated amorphous silicon film. The support substrate 31 is, for example, a glass substrate, an insulating substrate such as a plastic substrate, a semiconductor substrate such as a silicon wafer.

The thickness of the non-single crystal semiconductor film 33, for example, the dehydrogenated amorphous silicon film ranges 30 nm to 300 nm, and is, for example, 50 nm, typically. The insulating film 32 is a film provided to prevent undesirable impurities from diffusing from the support substrate 31 to the non-single crystal semiconductor film 33 during its crystallization process.

The cap insulating film 34 has a function of storing heat generated when the non-single crystal semiconductor film 33 is irradiated with the laser light for the crystallization by using reflecting properties and endothermal properties of the cap insulating film 34 to the crystallizing laser light. The heat storing effect of the cap insulating film 34 contributes to smoothing of a temperature gradient during cooling down after stopping the pulse laser light and enables the formation of crystal grains large in size (5 μm or more) in the molten area of the non-single crystal semiconductor film 33. The cap insulating film 34 enhances the efficiency of the crystallization, but it can be omitted.

FIG. 3 is a diagram showing one example of the excimer illumination optical system 20 in the crystallization optical system 2 used in the laser crystallization apparatus 100 shown in FIG. 1. The excimer illumination optical system 20 includes a beam expander 22 and the homogenizer 23 that are provided on the same optical axis as the excimer laser light source 21.

The laser light from the laser light source 21 is expanded by the beam expander 22 and homogenized in the in-plane intensity by the homogenizer 23, and then the laser light is irradiated to the phase shifter (phase modulating element) 24. The excimer laser light transmitted through the phase shifter 24 is modulated light having a predetermined light intensity distribution, for example, the inverse-peak-pattern light intensity distribution, and its direction is changed toward the processing substrate 30 by the reflecting mirror 25, and then the excimer laser light is irradiated onto the processing substrate 30 via the imaging optical system 26, for example, the excimer imaging optical system.

The laser light source 21 outputs a laser light with energy sufficient to melt the non-single crystal semiconductor film 33, for example, the amorphous or polycrystal semiconductor film provided on the processing substrate 30, for example, outputs light with energy of 1 J/cm$^2$ on the non-single crystal semiconductor film 33. The laser light source 21 is, for example, an excimer laser light source, and outputs pulse laser light having a short pulse, for example, a half-value width of about 25 to 30 nsec. The laser light is preferably, for example, KrF excimer laser light having a wavelength of 248 nm or XeCl excimer laser light having a wavelength of 308 nm. For example, the excimer laser source 21 is a pulse oscillating type and has an oscillation frequency ranging, for example, from 100 Hz to 300 Hz. In the present embodiment, the KrF excimer laser light having an oscillation frequency of 100 Hz and a half-value width of 25 nsec is used. Further, a light energy amount of the KrF excimer laser light irradiated onto the processing substrate 30 is, for example, about 1 J/cm$^2$ which is necessary to melt the non-single crystal silicon film. The laser source 21 emits the pulse laser light, and the intensity of the emitted light may change with time.

The beam expander 22 expands incident laser light, and comprises a concave lens 22a for expanding the light and a convex lens 22b for forming parallel light, as shown in FIG. 3.

The homogenizer 23 has a function to define a dimension of the incident laser light in an X-Y section and to homogenize a light intensity distribution within the defined shape. For example, a plurality of X-direction cylindrical lenses are arranged in the Y direction to form a plurality of light fluxes arranged in the Y direction, and the light fluxes are superposed on each other in the Y direction by an X-direction condenser lens and then redistributed. In the same manner, a plurality of Y-direction cylindrical lenses are arranged in the X direction to form a plurality of light fluxes arranged in the X direction, and the light fluxes are superposed on each other in the X direction by a Y-direction condenser lens and then redistributed. More specifically, as shown in FIG. 3, the homogenizer 23 comprises a first homogenizer including X-direction cylindrical lenses 23a and an X-direction condenser lens 23b, and a second homogenizer including Y-direction cylindrical lenses 23c and a Y-direction condenser lens 23d. The first homogenizer homogenizes the laser light intensity in the Y-axis direction on the phase shifter 24, and the second homogenizer homogenizes the laser light intensity in the X-axis direction on the phase shifter 24. Therefore, the KrF excimer laser light is conditioned by the homogenizer 23 to illumination light having a predetermined angle of spread and a homogenized light intensity in section, and irradiates the phase shifter 24.

The phase shifter 24 is one example of the phase modulating element, and is a quartz glass substrate with steps, for example. The laser light causes diffraction and interference at a boundary of the step to provide a periodic spatial distribution in the laser light intensity, and a phase difference of 180°, for example, is provided between right and left side of the step. The phase shifter 24 with a phase difference of 180° between right and left side of the step phase-modulates the incident light to light having a symmetrical inverse-peak-shaped light intensity distribution. A step (thickness difference) d can be derived from a relation of $d=\lambda/2(n-1)$, where $\lambda$ is the wavelength of the laser light and n is the refractive index of a transparent substrate of the phase shifter. From this equation, the phase shifter 24 can be produced by, for example, forming the step d on the quartz glass substrate corresponding to the predetermined phase difference of the light. For example, as the refractive index of the quartz substrate is 1.46, the wavelength of the KrF excimer laser light is 248 nm, thus a step height to provide a phase difference of 180° becomes 269.6 nm. The step of the quartz glass substrate can be formed by selective etching or a focused ion beam (FIB) processing. The phase shifter 24 has the step formed in such a manner that the incident light is phase-modulated to form the inverse-peak-shaped light intensity distribution, and shifts the phase of the excimer laser light by a half-wave length. As a result, the crystallizing laser light irradiating the semiconductor film 33 has the inverse-peak-pattern light intensity distribution in which a part corresponding to the phase-shifted portion (step) is at the minimum light intensity. According to this method, a predetermined light intensity distribution can be obtained without using a metal pattern, which is used in other methods and to shield the excimer laser light to obtain a predetermined light intensity distribution.

The crystallizing laser light which has been transmitted through the phase shifter 24 is imaged with a predetermined light intensity distribution on the processing substrate 30 disposed in a position conjugate with the phase shifter 24 by the excimer imaging optical system 26 whose aberration is corrected. The excimer imaging optical system 26 comprises a lens group including a plurality of calcium fluoride ($CaF_2$) lenses and/or synthetic quarts lenses, for example. The excimer imaging optical system 26 is a long focal distance lens having performance such as a reduction ratio of 1/5, an N.A. of 0.13, a resolution of 2 µm, a depth of focus of ±10 µm, a working distance ranging from 50 mm to 70 mm.

The excimer imaging optical system 26 arranges the phase shifter 24 and the processing substrate 30 at optically conjugate positions. In other words, the non-single crystal semiconductor film 33 on the processing substrate 30 is disposed in a surface optically conjugate with the phase shifter 24 (an image surface of the excimer imaging optical system 26). The excimer imaging optical system 26 is a telecentric optical system with an aperture stop between lenses.

Using such a crystallization optical system 2, the crystallizing laser light having a desired light intensity distribution can be irradiated to the processing substrate 30.

The crystallization process by the laser crystallization apparatus 100 as shown in FIG. 1 is based on the assumption that the crystallization is carried out so that the oscillation frequency of the crystallizing laser light is fixed and the substrate holding stage 40 is moved at a fixed velocity. The moving velocity of the substrate holding stage 40 is determined in accordance with the oscillation frequency (i.e., a laser irradiation period) of the crystallizing laser light source 21 and an area for one crystallizing laser light irradiation.

Conditions of the crystallizing laser light for the crystallization process includes, for example, a crystallization fluence of the crystallizing laser light of 1 $J/cm^2$, an oscillation frequency of the laser light source 21 of 100 Hz, a pulse width of the laser light of, for example, 30 nsec, and an irradiation area of 5 mm×10 mm. If the processing substrate 30 is irradiated without leaving unirradiated space with such conditions, then the substrate holding stage 40 moves 5 mm during an interval (100 Hz) of the irradiation of the laser light. That is, the moving velocity (V) of the substrate holding stage 40 has only to be set at V=5 mm×100 Hz=500 mm/sec. The pulse width of the laser light, for example, 30 nsec is such a short time that it can be said that the laser light is substantially stationary as compared with a moving velocity (V) of the substrate holding stage 40 of 500 mm/sec.

This is because the moving distance of the substrate holding stage 40 during the irradiation period of one pulse of the laser light is 500 mm/sec×30 nsec=15 nm. That is, the moving distance of the substrate holding stage 40 during 30 nsec, which is one-pulse irradiation period of the pulse laser light, is only 15 nm. In this moving distance, it can be considered that the substrate holding stage 40 is substantially in a stationary state, given that the diameter of a crystal grain generated in the irradiation period of 30 nsec is 5 µm to 10 µm. In other words, even if an positional accuracy required for a gate width of a thin film transistor formed in the crystallized area is one tenth or less of its gate width, for example, 0.5 µm, the moving velocity (V) of the substrate holding stage 40 can be considered that the crystallization process has been carried out while the substrate holding stage 40 is substantially in the stationary state.

Therefore, in this embodiment, the crystallizing laser light can be irradiated to the predetermined laser light irradiation area on the continuously moving processing substrate 30 to melt and crystallize the area. In other words, the crystallization process described above enables the crystallization by the pulse laser light while the substrate holding stage 40 is being continuously moved. The substrate holding stage 40 continuously moves in a predetermined direction, for example, in the X direction relative to the crystallizing laser light irradiation position by the laser light source 21.

Such a high moving velocity of the substrate holding stage 40 can be achieved by a driving mechanism which is a combination of an air bearing and a linear motor. However, the velocity stability of the air bearing/linear motor driving mechanism is about ±0.1% at most. Therefore, the positional accuracy when the laser oscillation frequency is fixed at 100 Hz and the crystallizing laser light is irradiated while continuously moving the substrate holding stage 40 at a velocity of 500 mm/sec results in (500 mm/sec±0.1%)×(1/100 sec)=5 mm±0.1%=4995 µm to 5005 µm, which causes an error of the irradiation position of ±5 µm. When the laser oscillation frequency is thus fixed, it is impossible to obtain a required positional accuracy of ±1 µm. That is, if the crystallization is carried out so that the oscillation frequency of the crystallizing laser light is fixed and the substrate holding stage 40 is moved at a fixed velocity, the position for forming the crystal grains can not be brought to a predetermined positional accuracy of 1 µm or less. Therefore, it is necessary to control and determine the irradiation timing of the crystallizing laser light on the basis of some positional measurement so that the laser light is irradiated to the predetermined irradiation position of the processing substrate 30 or the substrate holding stage 40.

In order to improve the throughput of the crystallization process and to highly accurately irradiate the laser to the predetermined position on the processing substrate 30 as described above, it is important to detect the position of the processing substrate 30 in move or the substrate holding stage 40 in real time and irradiate the crystallizing laser light on the basis of this detected information.

Figure 4:
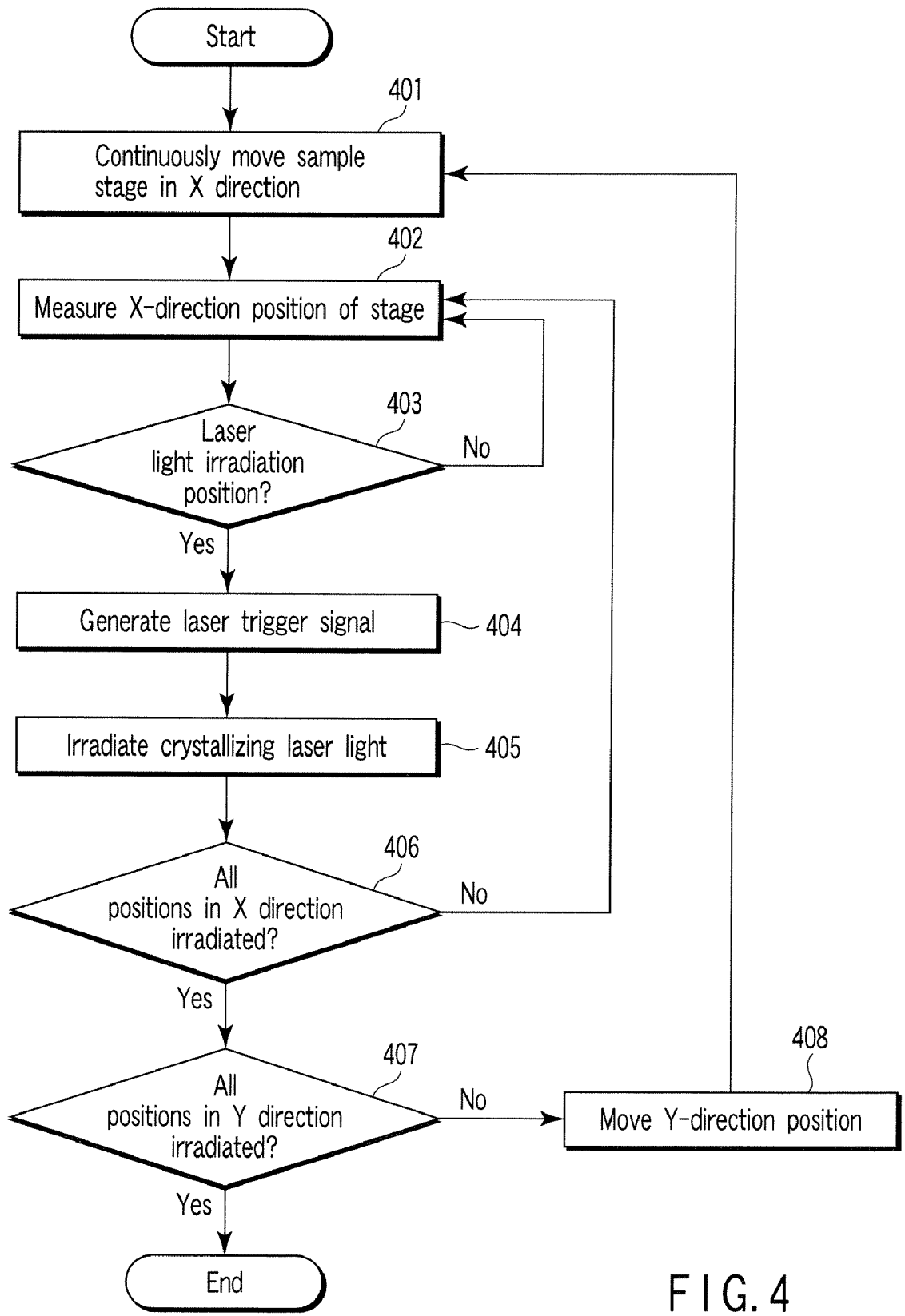
FIG. 4 is a flowchart shown to explain one example of a crystallization process according to the first embodiment of the present invention.

Next, the embodiment of this crystallization process will be described referring to FIG. 4. FIG. 4 is a flowchart to explain one example of the crystallization process according to the present embodiment. In this example, a case will be considered where the position in the X direction on the substrate holding stage 40 continuously moving in the X direction is measured in real time by the X-direction position measuring unit 52 so that a laser irradiation signal is generated by the laser trigger signal generating system 60 with a delay time of 1 μsec or less.

The crystallization process starts in step 401 by continuously moving the substrate holding stage 40 in the X direction. In step 402, the X-direction position measuring unit 52 measures in real time an X-direction position of the continuously moving substrate holding stage 40, and then sends position pulse signals to the laser trigger signal generating system 60 via the stage position control unit 51. The measuring position in the X direction can also be set a predetermined place on the processing substrate 30. The laser trigger signal generating system 60 counts the pulse signals, and decides whether the substrate holding stage 40 has reached at a crystallizing laser light irradiation position, in step 403.

When deciding that the substrate holding stage 40 has reached at the crystallizing laser light irradiation position, the laser trigger signal generating system 60 generates a laser trigger signal as a crystallizing laser light generation indicating signal and then sends it to the laser light source 21, in step 404. The time from the decision to the sending of the laser trigger signal is generally 1 μsec or less. In step 405, the laser light source 21 generates crystallizing laser light in response to the received trigger signal, and irradiates the crystallizing laser light onto the processing substrate 30. The delay time from the receipt of the trigger signal to the generation of the crystallizing laser light in the laser light source 21 is also 1 μsec or less.

Thus, a period from the detection of the crystallizing laser light irradiation position to the irradiation of the laser light to the substrate, that is, the delay time from step 403 to step 405 is (1+1) μsec or less. The moving distance, that is, displacement of the substrate holding stage 40 during this period is 500 mm/sec×(1+1) μsec=1 μm or less. The delay time within the laser trigger signal generating system 60 can be further reduced so that the amount of displacement can be reduced to sub-micrometer.

Subsequently, proceeding to step 406, the laser trigger signal generating system 60 decides whether all the predetermined positions in the X direction have been irradiated by the crystallizing laser light. If even a single place which is not irradiated is detected in the X direction, the crystallization process returns to step 402 and the irradiation of the laser light for crystallizing the unprocessed place is executed. If all the places in the X direction are irradiated, the crystallization process proceeds to step 407. In step 407, the laser trigger signal generating system 60 decides whether all the positions in the Y direction have been irradiated. If the laser trigger signal generating system 60 decides that there is a place which is not irradiated in the Y direction, the crystallization process proceeds to step 408, and the position in the Y direction is moved to the next position, and then returning to step 401. If all the positions in the Y direction have been irradiated, the laser trigger signal generating system 60 decides that the process of crystallizing one processing substrate 30 has been completed.

Next, the processing substrate 30 completed with the crystallization process is automatically unloaded, and the next processing substrate 30 is automatically loaded and disposed at a predetermined position on the substrate holding stage 40.

According to the present embodiment, time required for irradiating the crystallizing laser light with size of, for example, 10 mm×5 mm, on the whole area of a large-area substrate of, for example, 550 mm×650 mm is, for example, (650 mm/500 mm/sec)×(550 mm/10 mm)=71.5 sec.

Actually, the laser crystallization apparatus 100 repeats the X-direction scan 55 times in total by reversing X scanning direction every time when one X-direction scan on the processing substrate 30 mounted on the substrate holding stage 40 is completed and the stage 40 is moved to the next position in the Y direction. Therefore, the crystallization process requires time for the movement in the Y direction and deceleration and acceleration times for reversing the movement of the substrate holding stage 40 in the X direction. Even if these are taken into consideration, the throughput of the crystallization process enables the processing of about 20 to 30 pieces per hour, thereby achieving a high throughput according to the embodiment.

As described above, the laser crystallization apparatus 100 comprises the stage position measuring means and the laser trigger signal generating means, thereby positioning to the predetermined position very quickly and with a high positional accuracy and enabling to irradiate the crystallizing laser light. That is, the laser crystallization apparatus 100 can bring the delay time from the detection of the crystallizing laser light irradiation position to the irradiation of the laser light to 2 μsec or less, and can irradiate the laser light to the processing substrate 30 with a high positional accuracy of 1 μm or less. Therefore, the laser crystallization apparatus 100 can irradiate the crystallizing laser light having a predetermined light intensity distribution with a high positional accuracy onto the continuously moving processing substrate 30 at a high velocity. This makes it possible to provide the laser crystallization apparatus and the crystallization method with a high throughput capable of forming the semiconductor film having a large crystal grain size by melting and crystallizing the non-single crystal semiconductor film.

Second Embodiment

In the first embodiment, the positioning accuracy of the moving substrate holding stage in an X direction is improved by correcting variation in the moving velocity of the stage. However, even in a highly accurately controlling device of the substrate holding stage 40 using the air bearing/linear motor driving mechanism, it may be achieved a straightness in the Y and Z directions of about 10 μm at the best in the case of a high-velocity X-direction movement of about 500 mm/sec. Therefore, the laser crystallization apparatus 100 which is required to irradiate crystallizing laser light with a positional accuracy of 1 μm or less needs to make another simultaneous positional correction in the Y and/or Z direction while moving the substrate holding stage 40 in the X direction.

Figure 5:
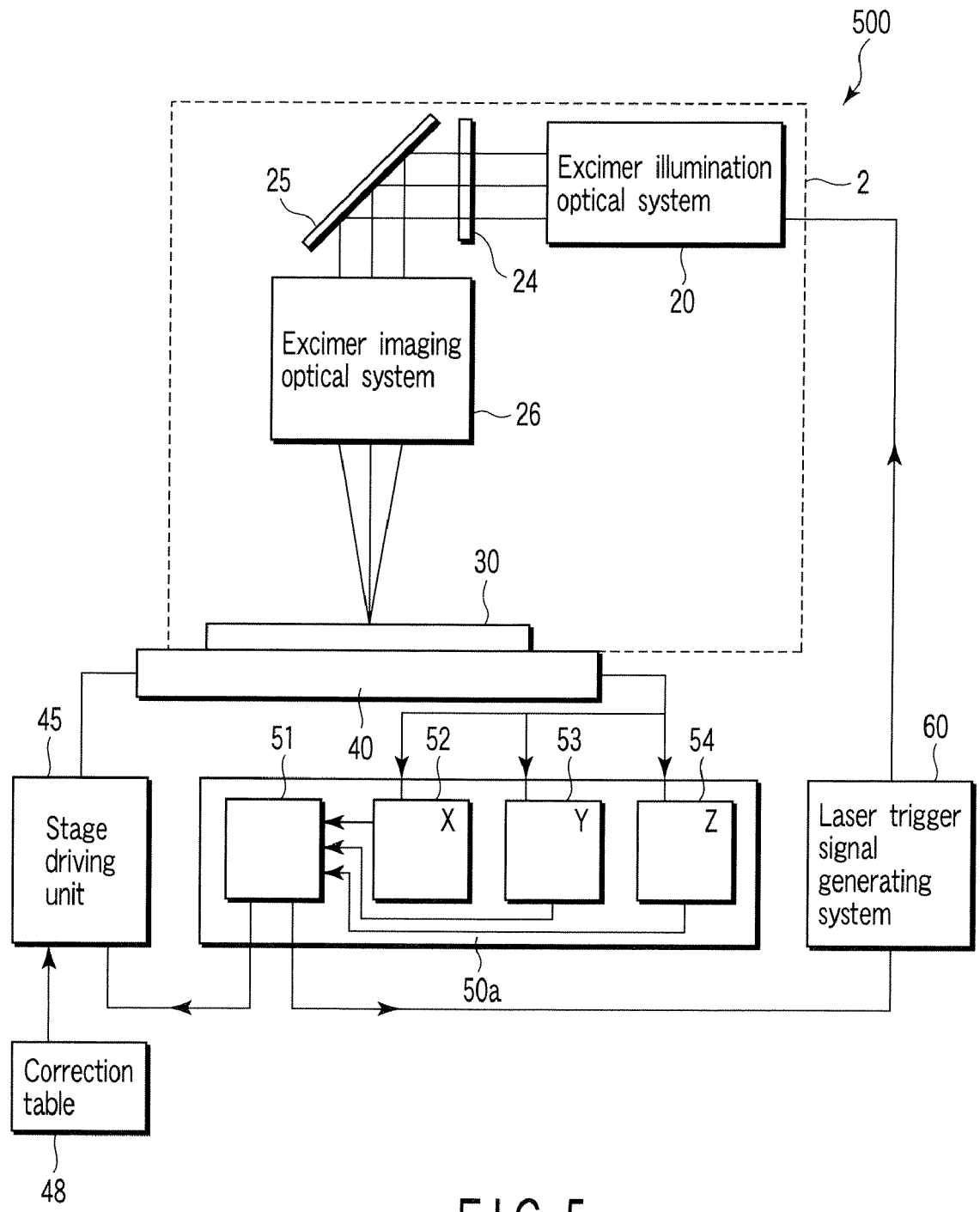
FIG. 5 is a diagram showing one example of a laser crystallization apparatus according to a second embodiment of the present invention.

A second embodiment of the present invention concerns a laser crystallization apparatus 500 which carries out crystallization so that a processing substrate is continuously moved in X direction while corrections are being made on a positional deviation in at least one of the Y and Z directions perpendicular to the moving direction (X direction) of the substrate holding stage 40, as shown in FIG. 5. The second embodiment illustrates the laser crystallization apparatus which achieves highly accurate positional control of an X-Y plane and highly accurate positional control of a Z-direction in height, that is, focusing accuracy. The same numerals refer to the same parts as those in FIG. 1, and these parts are not described in detail. The positional control in the Y direction means controlling the next laser light irradiation position in the X-scan direction. The positional control of the Z-direction in height means controlling the processing substrate 30 to be positioned at a focal plane of an excimer illumination optical system 20.

As shown in FIG. 5, the present embodiment is characterized in that a stage position measuring system 50a includes a Y-direction position measuring unit 53 and a Z-direction position measuring unit 54 in addition to a stage position control unit 51 and a X-direction position measuring unit 52 in the first embodiment. The stage position measuring system 50a measures the position of the moving substrate holding stage 40 with a higher positional accuracy. The stage position measuring system 50a supplies a position signal of the substrate holding stage 40 to a stage driving unit 45 and a laser trigger signal generating system 60.

The X-direction position measuring unit 52 and the Y-direction position measuring unit 53 measure the positions of the substrate holding stage 40 in the X and Y directions, respectively, very quickly and with a high positional accuracy on the order of several ten nm by use of, for example, a laser interferometer or a linear scale, as in the same manner as the X-direction position measuring unit 52 in the first embodiment.

The Z-direction position measuring unit 54 measures the height of the processing substrate 30, and it can be used, for example, the above-mentioned linear scale. However, although not shown in the drawings, the processing substrate 30 has variations in the Z direction due to swells of about several 10 μm in the thickness of a glass substrate, so that it is more effective to use a surface position measuring system, which measures an actual height of the surface of the processing substrate 30 by using surface reflection of the laser light. Regarding the position to be measured the height of the surface of the processing substrate 30, it can be measured any position other than a position where the crystallizing laser light is currently irradiated. In such case, it can be employed a method in which the height of the surface of the processing substrate 30 at the next irradiated position is measured in advance and stored in a memory and then is read from the memory at the irradiation of the laser light to control to make correction in the Z direction there.

The Y-direction position of the substrate holding stage 40 changes from the predetermined position depending on the straightness in the movement of the stage 40 and on the machining accuracy of the stage 40 as such. Thus, displacement in the Y direction during the continuous movement in the X direction is measured in advance, and data is stored in the memory as a correction table 48, for example. The Y-direction position of the substrate holding stage 40 during the continuous movement in the X direction is measured by the Y-direction position measuring unit 53. The measured result of the Y-direction position is sent to the stage driving unit 45 via the stage position control unit 51. The stage driving unit 45 compares the measured value with the previously stored value in the correction table 48 for the Y direction to output a displacement amount, and corrects and controls the Y-direction position of the substrate holding stage 40 so that the displacement amount becomes zero.

In the Z direction, the height of the surface of the processing substrate 30 changes due to the flatness, for example, thickness variation and bending, of the large-area processing substrate 30 in addition to the straightness in the vertical movement of the substrate holding stage 40. The position (height) in the Z direction is measured by the Z-direction position measuring unit 54. The Z-direction position measuring unit 54 measures the surface position, that is, height of the substrate holding stage 40 by use of the linear scale or the like, in the same manner as the X-direction and Y-direction position measuring units 52 and 53. The result of measurement in the Z direction is compared with the height data of the stage in the Z direction measured and stored in the correction table 48 in advance to correct and control the amount of deviation in the height direction. However, in this case, the height change in the Z direction due to the straightness in the movement of the substrate holding stage 40 can be corrected, but the height change due to a flatness of the processing substrate 30 mounted on the substrate holding stage 40 cannot be corrected.

If the large-area processing substrate 30 is a glass substrate, the amount of height change in the Z direction due to the flatness of the glass substrate as such is generally larger than 10 μm. There will be no problem as long as this amount of height change is within the focal depth of an excimer imaging optical system 26. However, the focal depth of the laser crystallization apparatus 500 is typically about ±5 to 10 μm, depending on the optical system of each laser crystallization apparatus 500. Therefore, a function of correcting the height in the Z direction due to the flatness of the processing substrate 30 is also required in the stage driving unit 45 of the laser crystallization apparatus 500.

Thus, in the stage position measuring system 50a, it is preferable to control the level of the processing substrate 30 while measuring the actual height of the surface of the processing substrate 30. As the Z-direction position measuring unit 54, it can be used, for example, a sample surface position measuring system 54 which uses surface reflection of the measurement laser light to measure the height of the surface of the processing substrate 30. The position for measuring the height of the processing substrate 30 can be displaced from the current irradiation position of the crystallizing laser light, and the surface height can be measured in advance, for example, at the position where the crystallizing laser light is irradiated next. Then, the Z-direction position measuring unit 54 feeds back the measured result to the stage driving unit 45 such that the Z-direction height of the processing substrate 30 can be controlled.

In this manner, the stage position measuring system 50a enables the highly accurate positioning in the Y direction and/or Z direction in addition to the highly accurate positioning in the X direction. Therefore, the laser crystallization apparatus 500 irradiates the crystallizing pulse laser light having an optically modulated light intensity distribution to a predetermined position on the processing substrate 30 positioned very quickly and with a high positional accuracy to melt and crystallize a non-single crystal semiconductor film 33. Therefore, it can be provided a laser crystallization apparatus and a crystallization method with a high throughput capable of forming a semiconductor film 33 having a large crystal grain size.

Third Embodiment

In the first and second embodiments, one crystallization optical system 2 has been used, the third embodiment concerns an example of a laser crystallization apparatus having a plurality of crystallization optical systems 2N.

Figure 6:
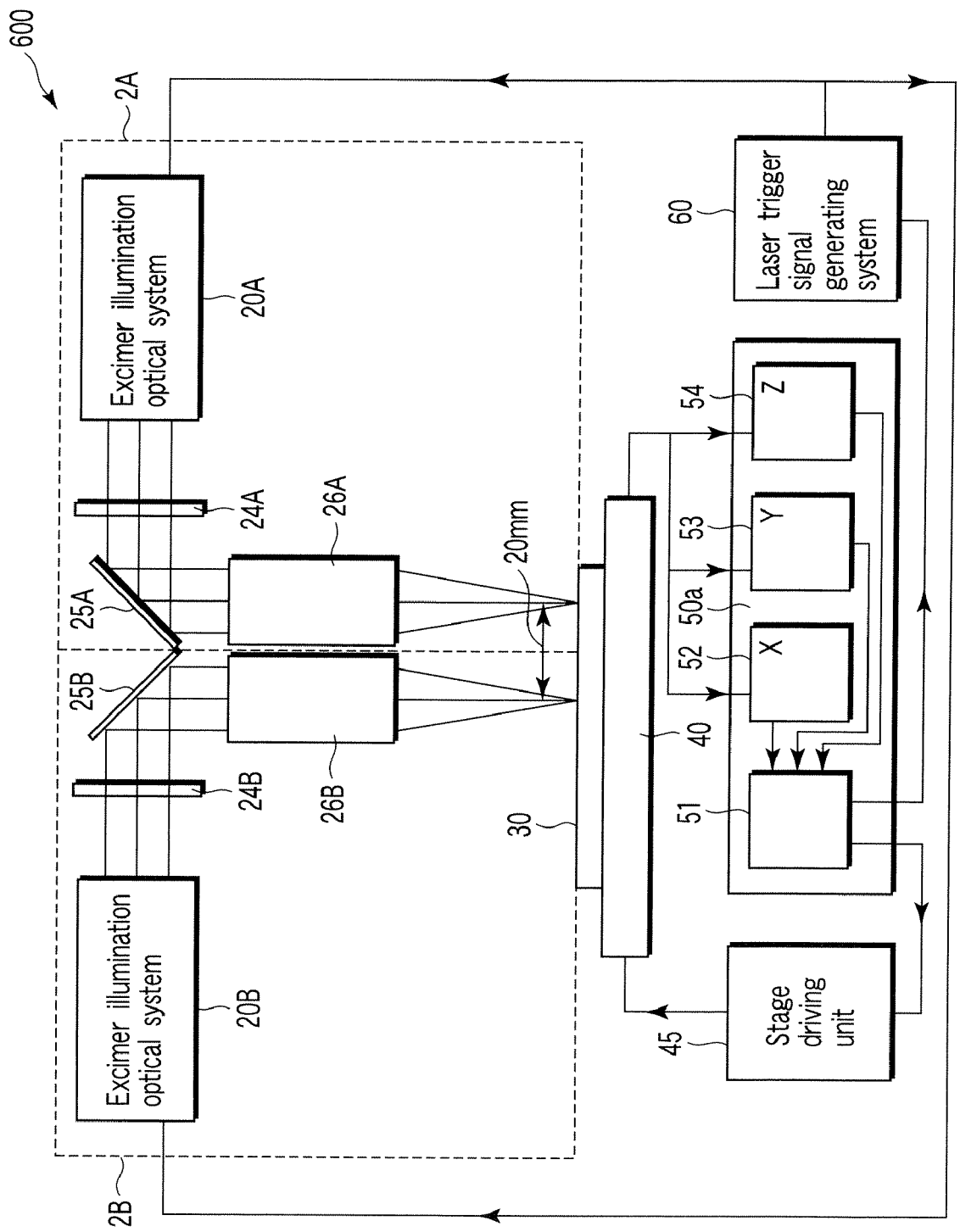
FIG. 6 is a diagram showing one example of a laser crystallization apparatus according to a third embodiment of the present invention.

FIG. 6 is a diagram showing one example of a laser crystallization apparatus 600 in the present embodiment. The same numerals are assigned to the same parts as those in FIG. 5, and these parts are not described in detail. In FIG. 6, for simplicity of explanation, there is shown an example in which two crystallization optical systems, for example, a first and second crystallization optical systems 2A and 2B, are arranged apart in a Y direction, which is vertical to the scanning direction (X direction) of a substrate holding stage 40. However, the number of crystallization optical systems and the arrangement thereof are not limited to the above. In FIG. 6, alphabetical signs are added to the numerical signs of the same optical components to distinguish from the optical system in FIG. 5.

Referring to FIG. 6, the first and second crystallization optical systems 2A and 2B are arranged so that they are assigned to irradiation separate positions apart by 20 mm in the Y direction on the substrate holding stage 40 for example, since a size in the Y direction of one irradiation area of the crystallizing laser light is 10 mm, in this case. In such an irradiation method in which the irradiated areas on a processing substrate 30 are assigned, two separate areas of the processing substrate 30 can be simultaneously crystallized, and the time for the crystallization can be reduced to nearly half of that in the first embodiment.

Regarding the areas irradiated by the first and second crystallization optical systems 2A and 2B, the area on the crystallization substrate 30 may be assigned the adjacent irradiation areas as in the embodiment in FIG. 6, or may be previously divided into half areas A and B so that the crystallization optical systems 2A and 2B are responsible for simultaneously irradiating the A area and B area, respectively. The timings of the irradiations by the first and second crystallization optical systems 2A and 2B may be simultaneous or staggered.

Figure 7:
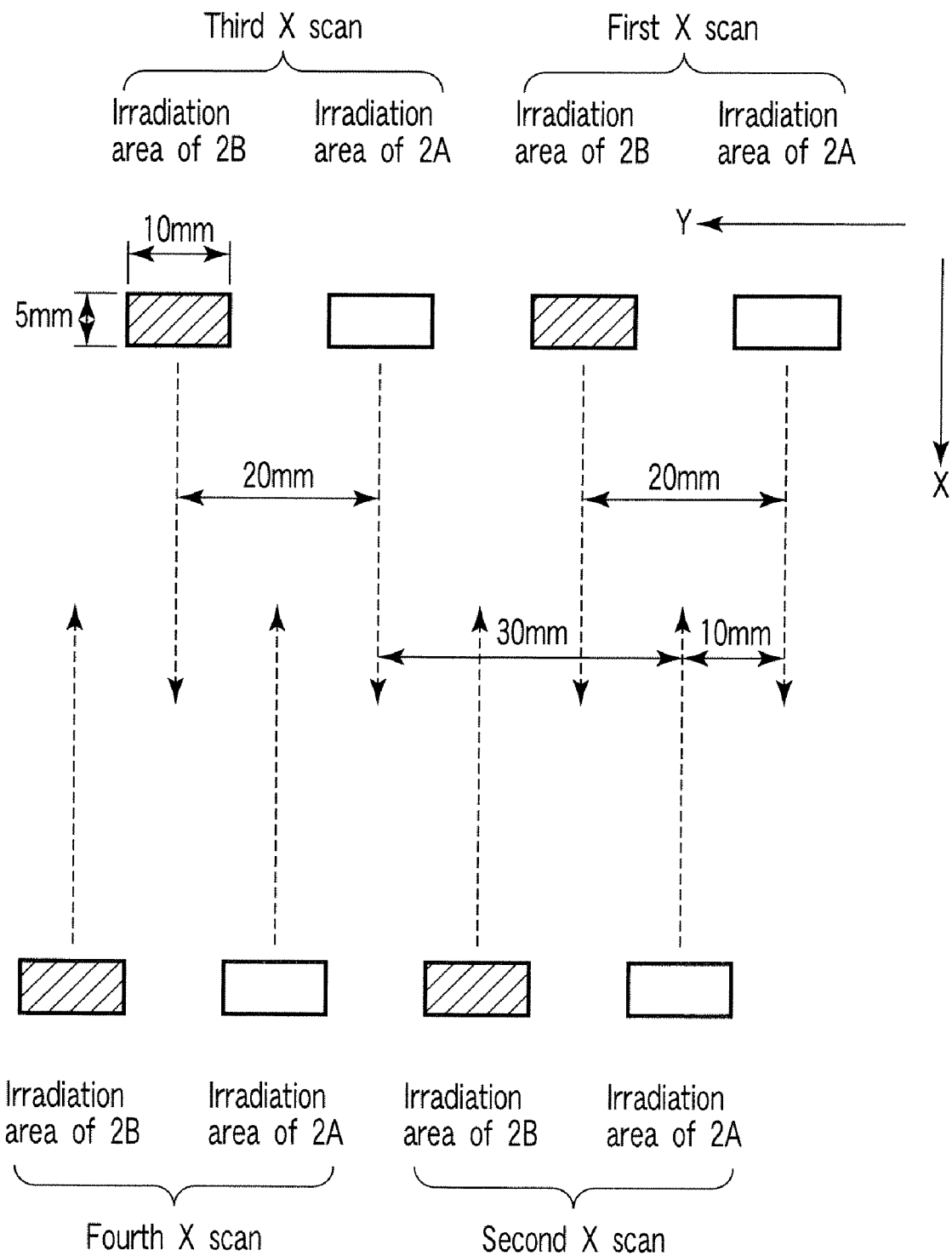
FIG. 7 is a diagram showing one example of areas to which laser light is irradiated by the laser crystallization apparatus according to the third embodiment of the present invention.

One example of the relation of the areas irradiated with the crystallizing laser light by the laser crystallization apparatus 600 in FIG. 6 is shown in FIG. 7. In FIG. 7, a vertical direction indicates the X direction in which the substrate holding stage 40 continuously moves, and a horizontal direction indicates the Y direction. In the X direction, the irradiation area moves from top to bottom in the drawing at odd scanning times such as the first time and the third time, while the irradiation area moves from bottom to top at even scanning times. (Actually, the irradiation position is fixed, and the processing substrate 30 moves.) The areas irradiated by the first and second crystallization optical systems 2A and 2B are parallel areas separate by 20 mm in the Y direction in one X-scan (e.g., from top to bottom). In other words, a non-crystallized area having a width of 10 mm is remained between the two crystallized areas having a width of 10 mm which are irradiated by the crystallizing laser lights from the first and second crystallization optical systems 2A and 2B. This non-crystallized area is irradiated by the laser light when the substrate holding stage 40 moves for return to execute the crystallization process for the next scan, that is, when the substrate holding stage 40 moves in the opposite direction, such that the crystallization process is executed for all the areas on the non-single crystal semiconductor substrate 30. Therefore, in this irradiation method of the embodiment, for example, the moving amount in the Y direction of the substrate holding stage 40 is 10 mm in the left direction when a move is made from the odd time to the even time in X-scan, and 30 mm to the left when a move is made from the even time to the odd time, such that the whole area of the processing substrate 30 can be crystallized without leaving unirradiated space.

In the irradiation method of the present embodiment, the crystallization can be carried out while corrections are made for the positions in the X, Y and Z directions of the substrate holding stage 40, as in the first and second embodiments. The highly accurate correction and control of the position in the X and Y directions can be performed by the above described method without problems. However, regarding the correction in the Z direction, the two irradiation areas simultaneously irradiated with the two crystallizing laser lights are separate. Thus, in the irradiated area away from the measurement position of the Z-direction position measuring unit 54, there is a possibility that the height in the Z direction is not properly corrected. However, the difference of heights between the positions separate by about 20 mm is small and 1 to 2 μm or less at most in the flatness of the processing substrate 30, typically, so that this difference is sufficiently smaller than the depth of the focus of an excimer imaging optical system 26 and causes no problem.

Thus, according to the present embodiment, the plurality of crystallization optical systems 2 are used so that a plurality of crystallization areas can be crystallized simultaneously or with a delay, thereby allowing to provide a higher throughput of the laser crystallization apparatus and, at the same time, highly accurate positioning in the X direction, Y direction and/or Z direction. Further, according to the present embodiment, it can be provided a laser crystallization apparatus irradiates a plurality of crystallizing laser lights having optically modulated light intensity distributions to the substrate positioned at a predetermined position very quickly and with a high positional accuracy to melt and crystallize a non-single crystal semiconductor film 33, such that it can be provided a laser crystallization apparatus and a crystallization method with a high throughput capable of forming the semiconductor film 33 having a large crystal grain size.

Fourth Embodiment

A fourth embodiment of the present invention concerns a laser crystallization apparatus 800 which uses two crystallization optical systems, for example, first and second crystallization optical systems 2A and 2B to sequentially irradiate crystallizing laser lights to positions apart by a few μm on a semiconductor film 32 and thus crystallize the same.

In the present embodiment, the crystallizing laser light is irradiated to almost the same irradiation area on a continuously moving processing substrate 30 a plurality of times to achieve crystallization. In the embodiment in which the crystallizing laser light is irradiated to almost the same irradiation area a plurality of times, for example, the first crystallizing laser light is irradiated, and then the second crystallizing laser light is irradiated so that most of the area irradiated with the second crystallizing laser light overlaps with the area irradiated with the first crystallizing laser light. In this embodiment, in the semiconductor film in which large crystal grains are formed by the first laser crystallization, the second crystallizing laser light is further irradiated to a position separate by a few μm in the growth direction of the crystal grains, such that the semiconductor film can be re-crystallized to have larger rectangular crystal grains.

When the crystallization is carried out only one time, crystal grains having small sizes and different crystal orientations tend to be formed at a crystal growth starting position which is a place where the intensity of the laser light is minimum, and furthermore, particular crystal grains among them are preferentially grown into large crystal grain shapes whose bases are small. Then, the second crystallizing laser light is irradiated with a displacement of a few μm to melt the above-mentioned small crystal grains and cause crystal growth of the large crystal grains, serving as seed crystals, into much larger square crystal grains.

In the present embodiment, the irradiation positions of the crystallizing laser light are accurately controlled by a stage position measuring system 50a, in addition to the technique described above. Thus, such a plurality of irradiations of the crystallizing laser light are desirably carried out by using a plurality of crystallization optical systems.

Figure 8:
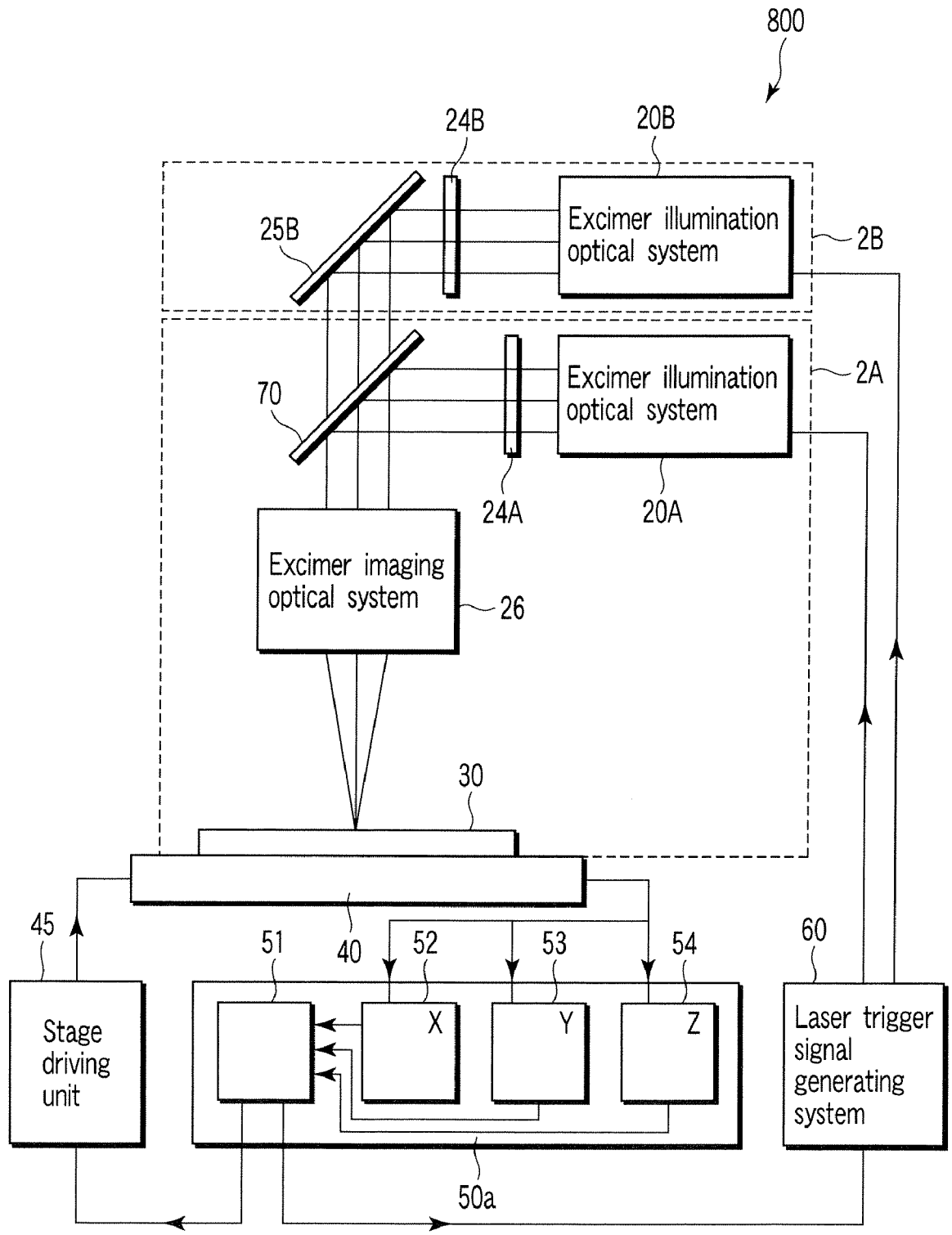
FIG. 8 is a diagram showing one example of a laser crystallization apparatus according to a fourth embodiment of the present invention.

One example of the laser crystallization apparatus 800 according to the present embodiment is shown in FIG. 8. As shown, the first and second crystallization optical systems 2A and 2B share one excimer imaging optical system 26. Therefore, the first and second crystallizing laser lights irradiate the processing substrate 30 along the same optical axis in the laser crystallization apparatus 800.

One example of a crystallization process in the present embodiment will be described below with reference to FIGS. 8 and 9. Referring to FIG. 8, the first and second excimer illumination optical systems 20A and 20B comprise P polarizing and S polarizing laser light sources (not shown), respectively, and are designed to irradiate the same area of the processing substrate 30 via the single excimer imaging optical system 26. First and second phase shifters 24A and 24B are placed so that they are at an equal distance from the processing substrate 30. A polarizing mirror 70 reflects P polarized light from the first illumination optical system 20A and transmits S polarized light from the second illumination optical system 20B.

Figure 9:
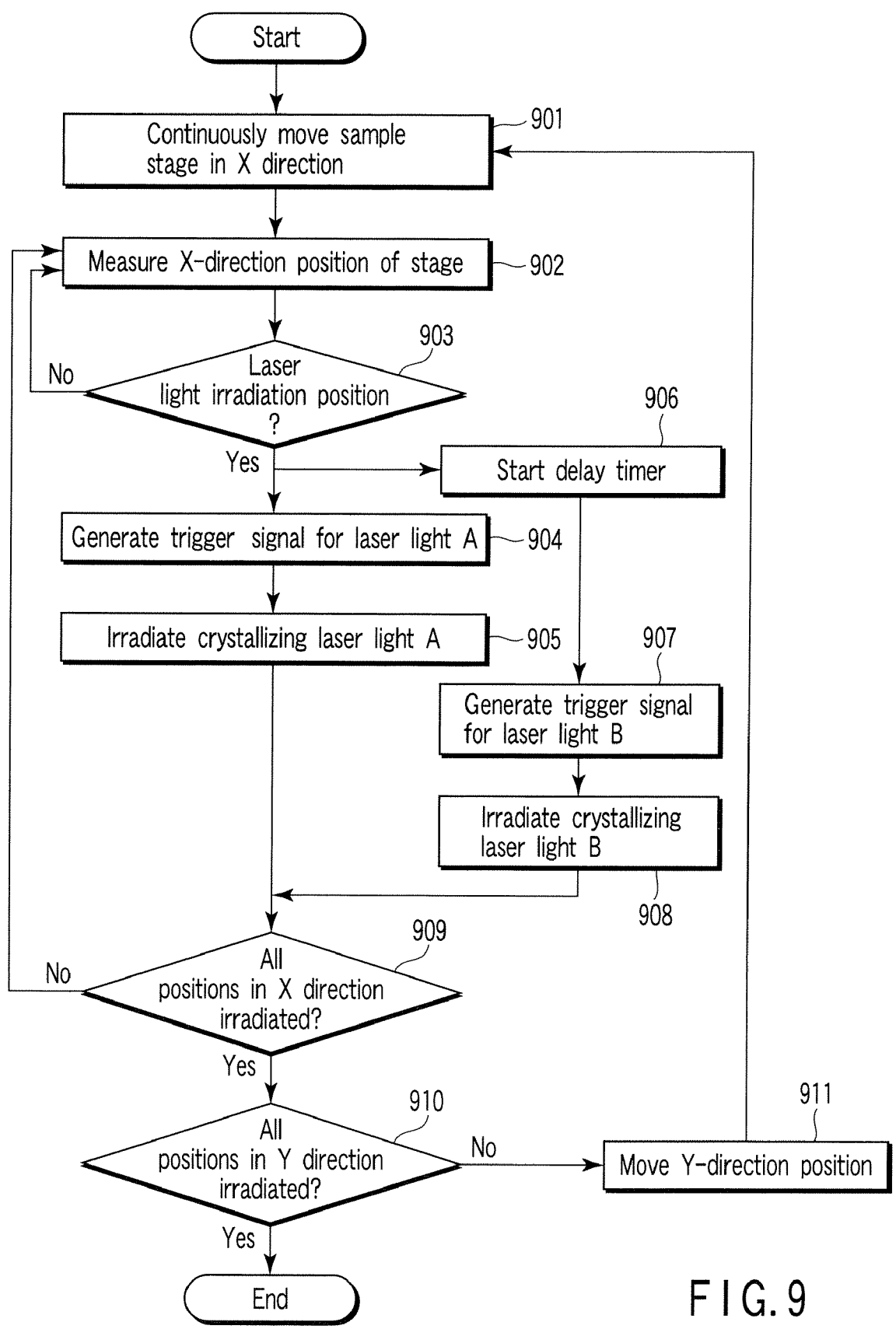
FIG. 9 is a flowchart shown to explain one example of a crystallization process according to the fourth embodiment of the present invention.

FIG. 9 is a flowchart showing one example of the crystallization process in the present embodiment. Steps 901 to 903 are the same as steps 401 to 403 in the first embodiment, and therefore, are not described in detail. It is decided in step 903 whether the position of a substrate holding stage 40 moving in an X direction is at a crystallizing laser light irradiation position. If it is at the crystallizing laser light irradiation position, a laser trigger signal generating system 60 generates a first crystallizing laser light trigger signal and sends it to a first laser light source 21A, as in the first embodiment, in step 904. In step 905, the first laser light source 21A generates a first crystallizing laser light in response to the first trigger signal, and irradiates the processing substrate 30.

The laser trigger signal generating system 60 sends the first crystallizing laser light trigger signal to the first laser light source 21A, and at the same time, starts a delay timer for a second laser light source 21B (step 906). A delay time Td set in the delay timer can be decided as follows.

The size of a crystal grain that can be formed in one crystallization process is generally 5 to 10 μm. The irradiation position of the second crystallizing laser light is displaced, for example, by 3 μm. If the moving velocity of the substrate holding stage 40 is 500 mm/sec, the delay time Td can be obtained by equation below.

$$Td=3\times 10^{-6}(m)/5\times 10^{-1}(m/sec)=6\times 10^{-6}(sec)=6 \,\mu sec$$

On the other hand, the crystallization by the irradiation of the laser light in a PMELA apparatus is completed in 0.1 to 0.2 μsec after the irradiation of the laser light. Therefore, at the irradiation of the second crystallizing laser light after a delay time of 6 μsec, the crystallization by the first crystallizing laser light irradiation is completely finished, and large crystal grains are formed in a non-single crystal semiconductor film 33.

After the predetermined delay time Td has passed, the laser trigger signal generating system 60 sends a second laser light trigger signal to the second laser light source 21B in step 907. In step 908, the second laser light source 21B irradiates a second crystallizing laser light in response to the second trigger signal.

Thus, the irradiation timings of the first and second laser light sources 21A and 21B are slightly staggered, such that the first and second crystallizing laser lights can be irradiated with high positional accuracy to the positions separate by only a few μm on the continuously moving processing substrate 30.

Then, the laser trigger signal generating system decides whether all the positions in the X direction have been irradiated (step 909), and decides whether all the positions in the Y direction have been irradiated (step 910), as in and after step 406 in the first embodiment. If the whole area of the processing substrate 30 has been irradiated, then the process is completed. If the laser trigger signal generating system decides that there is a place which is not irradiated in the Y direction, the crystallization process proceeds to step 911, and the position in the Y direction is moved to the next position.

While the present embodiment has been described in accordance with the first embodiment, the positional correction in the Y direction and/or Z direction can also be made together as in the second embodiment.

In this manner, a plurality of crystallizing laser lights, for example, two crystallizing laser lights are sequentially irradiated to the non-single crystal semiconductor film 33 on the processing substrate 30 with a slight difference (delay) of several μsec, such that larger crystal grains can be grown in the thin film 33. Moreover, positioning is highly accurately controlled in the X direction, Y direction and/or Z direction while the processing substrate is being continuously moved, such that it can be irradiated the crystallizing laser light having a predetermined light intensity distribution. This makes it possible to provide a laser crystallization apparatus and a crystallization method with a high throughput capable of melting and crystallizing the non-single crystal semiconductor film to form a semiconductor film having a large crystal grain size.

The present invention is not limited to the embodiment described above, and various modifications can be made. For example, the projection irradiation method has been described by way of example in FIG. 1 in which an image of the phase shifter is projected onto the processing substrate via an imaging lens, but it can also be employed a proximity irradiation method in which the phase shifter is disposed in proximity to the processing substrate.

According to one aspect of the present invention, there are provided a laser crystallization apparatus and a crystallization method, the laser crystallization apparatus comprises: a laser light source which generates laser light; and a phase shifter which modulates the laser light to transmit the laser light having a predetermined light intensity distribution, wherein the laser light modulated by the phase shifter is irradiated to a thin film provided on a processing substrate to melt and crystallize an irradiation area of the thin film, and the laser crystallization apparatus is characterized in that the apparatus comprises: a substrate holding stage which mounts the processing substrate and which continuously moves in a predetermined direction relating to pulse laser light irradiating positions; position measuring means for measuring the position of the substrate holding stage continuously moving in the predetermined direction; and signal generating means for indicating the generation of the laser light on the basis of the position of the substrate holding stage measured by the position measuring means, and the thin film is an amorphous silicon film.

Furthermore, the laser crystallization apparatus and the crystallization method are characterized in that the laser light is excimer laser. In another embodiment, the laser crystallization apparatus and the crystallization method are characterized in that the laser light is irradiated to a plurality of predetermined positions on the thin film. In another embodiment, the laser crystallization apparatus and the crystallization method are characterized in that the position of the substrate holding stage in at least one direction perpendicular to the direction of the continuous movement is controlled. In another embodiment, the laser crystallization apparatus and the crystallization method are characterized in that the direction perpendicular to the direction of the continuous movement includes one direction within the surface of the thin film, and the straightness of the continuous movement is controlled to 10 micrometers or less. In another embodiment, the laser crystallization apparatus and the crystallization method are characterized in that the direction perpendicular to the direction of the continuous movement includes a direction vertical to the surface of the thin film, and there is provided second position measuring means for measuring the position of the substrate holding stage in the direction vertical to the surface of the thin film. In another embodiment, the laser crystallization apparatus and the crystallization method are characterized in that the second position measuring means comprises a laser reflecting type detector. In another embodiment, the laser crystallization apparatus and the crystallization method are characterized in that the position measured by the second position measuring means is a position which is on the direction of the continuous movement and which precedes the position irradiated with the laser light. In another embodiment, the laser crystallization apparatus and the crystallization method are characterized in that the accuracy of controlling the position of the substrate holding stage in the direction perpendicular to the direction of the continuous movement is controlled to 5 micrometers or less. In another embodiment, the laser crystallization apparatus and the crystallization method are characterized in that the position measuring means comprises a laser interferometer. In another embodiment, the laser crystallization apparatus and the crystallization method are characterized in that the position measuring means comprises a linear scale. In another embodiment, the laser crystallization apparatus and the crystallization method are characterized in that a delay time from the measurement of the position of the substrate holding stage by the position measuring means to the generation of the signal indicating the irradiation of the laser light by the signal generating means is 1 microsecond or less. In another embodiment, the laser crystallization apparatus and the crystallization method are characterized in that the continuous movement of the substrate holding stage is velocity controlled.

According to another aspect of the present invention, there is provided a laser crystallization apparatus, the laser crystallization apparatus comprises: a plurality of laser light sources which generates laser lights; and a plurality of phase shifters which modulate the respective laser lights to transmit the laser lights having a predetermined light intensity distribution, wherein the plurality of laser lights modulated by the phase shifters is irradiated to a thin film provided on a processing substrate to melt and crystallize an irradiated area of the thin film, and the laser crystallization apparatus is characterized in that the apparatus comprises: a substrate holding stage which mounts the processing substrate and which continuously moves in a predetermined direction relating to pulse laser light irradiating positions; position measuring means for measuring the position of the substrate holding stage continuously moving in the predetermined direction; and signal generating means for indicating the generation of the laser lights on the basis of the position of the substrate holding stage measured by the position measuring means, and the thin film is an amorphous silicon film. Further, the laser crystallization apparatus is characterized in that the laser light is excimer laser.

In another embodiment, the laser crystallization apparatus and the crystallization method are characterized in that the laser lights are irradiated to a plurality of predetermined positions on the thin film. In another embodiment, the laser crystallization apparatus and the crystallization method are characterized in that the laser lights are irradiated to different positions which are on the direction of the continuous movement and which are separate by 1 to 30 micrometers on the thin film. In another embodiment, the laser crystallization apparatus and the crystallization method are characterized in that the position of the substrate holding stage in at least one direction perpendicular to the direction of the continuous movement is controlled. In another embodiment, the laser crystallization apparatus and the crystallization method are characterized in that the direction perpendicular to the direction of the continuous movement includes one direction within the surface of the thin film, and the straightness of the continuous movement is controlled to 10 micrometers or less. In another embodiment, the laser crystallization apparatus and the crystallization method are characterized in that the direction perpendicular to the direction of the continuous movement includes a direction vertical to the surface of the thin film, and there is provided second position measuring means for measuring the position of the substrate holding stage in the direction vertical to the surface of the thin film. In another embodiment, the laser crystallization apparatus and the crystallization method are characterized in that the second position measuring means comprises a laser reflecting type detector. In another embodiment, the laser crystallization apparatus and the crystallization method are characterized in that the position measured by the second position measuring means is a position which is on the direction of the continuous movement and which precedes the position irradiated with the laser lights. In another embodiment, the laser crystallization apparatus and the crystallization method are characterized in that the accuracy of controlling the position of the substrate holding stage in the direction perpendicular to the direction of the continuous movement is controlled to 5 micrometers or less. In another embodiment, the laser crystallization apparatus and the crystallization method are characterized in that the position measuring means comprises a laser interferometer. In another embodiment, the laser crystallization apparatus and the crystallization method are characterized in that the position measuring means comprises a linear scale. In another embodiment, the laser crystallization apparatus and the crystallization method are characterized in that a delay time from the measurement of the position of the substrate holding stage by the position measuring means to the generation of the signal indicating the irradiation of the laser lights by the signal generating means is 1 microsecond or less. In another embodiment, the laser crystallization apparatus and the crystallization method are characterized in that the continuous movement of the substrate holding stage is velocity controlled.

The present invention is not limited to the embodiments described above, and various modifications can be made. For example, the projection irradiation scheme has been described by way of example in FIG. 1 in which an image of the phase shifter is projected onto the processing substrate via an imaging lens, but it can also be employed a proximity irradiation scheme in which the phase shifter is disposed in proximity to the processing substrate.

As described above, in the present invention, the laser crystallization apparatus comprises the position measuring means and the laser trigger signal generating means. This makes it possible to provide a laser crystallization apparatus and a crystallization method with a high throughput capable of forming a high-quality semiconductor film having a large crystal grain size in a highly accurately positioned area while continuously moving the processing substrate.

The above description of the embodiments disclosed herein has been given such that those skilled in the art can make and use the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A laser crystallization apparatus for crystallizing a thin film provided on a processing substrate continuously moving by irradiating a modulated pulse laser light on a predetermined area of the thin film to melt and crystallize the thin film to form crystal grains at a predetermined position of the thin film with a high throughput, the laser crystallization apparatus comprising:
   a laser light source which generates pulse laser light on the basis of an input of a laser light generation indicating signal;
   a phase modulating element which is provided on an optical path of the laser light and which modulates the pulse laser light by diffraction to transmit the pulse laser light having a predetermined light intensity distribution;
   an imaging optical system which forms a transmitted image of the phase modulating element on the thin film;
   a substrate holding stage which mounts the processing substrate and which continuously moves the processing substrate in a predetermined direction related to pulse laser light irradiating positions and moves the processing substrate in another direction perpendicular to the predetermined direction after irradiation to all places in the predetermined direction is finished;
   a position measuring unit which measures in real time a predetermined position of the processing substrate or the substrate holding stage continuously moving at a constant speed in the predetermined direction;
   a stage position control unit which includes a servomechanism for feedback-controlling the moving speed of the substrate holding stage within a predetermined accuracy on the basis of measured positional information;
   a stage driving unit which includes an air bearing and a linear motor driving mechanism, and which controls a movement of the substrate holding stage with positional accuracy and reproducibility; and
   a signal generating unit which indicates the generation of the pulse laser light on the basis of the position of the substrate holding stage measured by the position measuring unit,
   wherein the crystal grains start to crystallize and grow laterally in the thin film, from a crystal growth starting position, which is a place where the intensity of the modulated pulse laser light is minimum, during cooling down after stopping the pulse laser light irradiation, thereby forming the crystal grains at the predetermined position defined by the light intensity distribution of the pulse laser light.

2. The laser crystallization apparatus according to claim 1, wherein the laser light source generates the pulse laser light synchronously with input of the laser light generation indicating signal.

3. The laser crystallization apparatus according to claim 1, wherein the substrate holding stage includes a first control system adjusting a laser light irradiation position in an X direction, a second control system adjusting the laser light irradiation position in a Y direction, and/or a third control system adjusting a height of the laser light irradiation position in a Z direction to a focal plane of the laser light.

4. The laser crystallization apparatus according to claim 3, wherein the laser light source generates the pulse laser light synchronously with input of the laser light generation indicating signal.

5. A laser crystallization apparatus for crystallizing a thin film provided on a processing substrate continuously moving by irradiating a modulated pulse laser light on a predetermined area of the thin film to melt and crystallize the thin film to form crystal grains at a predetermined position of the thin film with a high throughput, the laser crystallization apparatus comprising:
   a plurality of laser light sources which generate pulse laser lights on the basis of an input of a laser light generation indicating signal;
   a plurality of phase modulating elements which are provided on optical paths of the respective laser lights and which modulate the pulse laser lights by diffraction to transmit the pulse laser lights having a predetermined light intensity distribution;
   a plurality of imaging optical systems which irradiate the modulated pulse laser lights on the thin film to melt and crystallize a plurality of irradiated areas of the thin film;
   a substrate holding stage which mounts the processing substrate and which continuously moves the processing substrate in a predetermined direction related to pulse laser light irradiating positions and moves the processing substrate in another direction perpendicular to the predetermined direction after irradiation to all places in the predetermined direction is finished;
   a position measuring unit which measures in real time a predetermined position of the substrate holding stage continuously moving at a constant speed in the predetermined direction;
   a stage position control unit which includes a servomechanism for feedback-controlling the moving speed of the substrate holding stage within a predetermined accuracy on the basis of measured positional information;
   a stage driving unit which includes an air bearing and a linear motor driving mechanism, and which controls a movement of the substrate holding stage with positional accuracy and reproducibility; and
   a signal generating unit which indicates the generation of the pulse laser light on the basis of the position of the substrate holding stage measured by the position measuring unit,
   wherein the crystal grains start to crystallize and grow laterally in the thin film from a crystal growth starting position, which is a place where the intensity of the modulated pulse laser light is minimum, during cooling down after stopping the pulse laser light irradiation, thereby forming the crystal drains at the predetermined position defined by the light intensity distribution of the pulse laser light.

6. The laser crystallization apparatus according to claim 5, wherein the laser light source generates the pulse laser light synchronously with input of the laser light generation indicating signal.

7. The laser crystallization apparatus according to claim 5, wherein the plurality of laser light sources are arranged to simultaneously irradiate the pulse laser lights to different positions on the thin film disposed in a second direction perpendicular to the direction of the continuous movement.

8. The laser crystallization apparatus according to claim 7, wherein the laser light source generates the pulse laser light synchronously with input of the laser light generation indicating signal.

9. The laser crystallization apparatus according to claim 5, wherein the modulated pulse laser light from the plurality of imaging optical systems is directed to a common imaging optical system, and wherein the pulse laser lights generated by the plurality of laser light sources are controlled to irradiate to different positions on the thin film in the direction of the continuous movement.

10. The laser crystallization apparatus according to claim 9, wherein each of the plurality of laser light sources generates the pulse laser light synchronously with input of respective laser light generation indicating signals.

11. A laser crystallization method for forming crystal grains at a predetermined position of a crystallization thin film provided on a processing substrate with a high throughput, the laser crystallization method comprising:
continuously moving a substrate holding stage, which mounts the processing substrate thereon, in a predetermined direction;
measuring a predetermined position on the processing substrate or the substrate holding stage continuously moving at a constant speed in real time to generate a measured positional information;
feedback-controlling the moving speed of the substrate holding stage within a predetermined accuracy and moving the substrate holding stage with positional accuracy and reproducibility, on the basis of measured positional information; wherein the moving the substrate holding stage is carried out by an air bearing and a linear motor driving mechanism;
outputting a laser light generation indicating signal which indicates generation of laser light on the basis of the measured position information;
generating pulse laser light on receipt of the laser light generation indicating signal;
modulating the pulse laser light by diffraction to have a predetermined light intensity distribution; and
irradiating the modulated pulse laser light on the processing substrate to melt and crystallize a predetermined irradiated area of the crystallization thin film provided on the processing substrate to grow crystal grains laterally in the crystallization thin film from a crystal growth starting position, which is a place where the intensity of the modulated pulse laser light is minimum, during cooling down after stopping the pulse laser light irradiation, thereby forming the crystal grains at the predetermined position in the crystallization thin film defined by the light intensity distribution of the pulse laser light.

12. The laser crystallization method according to claim 11, wherein the moving the substrate holding stage includes aligning the measured position with a predetermined crystallizing position in X direction and Y direction, and/or aligning the measured position in Z direction with a focal plane of the pulse laser light.

13. The laser crystallization method according to claim 11, wherein the generating the pulse laser light includes generating the pulse laser light synchronously with an input of the laser light generation indicating signal.

14. The laser crystallization method according to claim 11, wherein the pulse laser light irradiating the processing substrate has a plurality of pulse laser light paths, and irradiates different areas of the processing substrate.

15. The laser crystallization method according to claim 14, wherein the moving the substrate holding stage includes aligning the measured position with a predetermined crystallizing position in X direction and Y direction, and/or aligning the measured position in Z direction with a focal plane of the pulse laser light.

16. The laser crystallization method according to claim 14, wherein the generating the pulse laser light includes generating the pulse laser light synchronously with an input of the laser light generation indicating signal.

17. The laser crystallization apparatus according to claim 1, wherein the stage driving unit corrects displacement of the measured position of the substrate holding stage from a predetermined position of the substrate holding stage on the basis of the measured positional information.

18. The laser crystallization apparatus according to claim 5, wherein the stage driving unit corrects displacement of the measured position of the substrate holding stage from a predetermined position of the substrate holding stage on the basis of the measured positional information.

19. The laser crystallization method according to claim 11, wherein the moving the substrate holding stage further comprises correcting displacement of the measured position of the substrate holding stage from a predetermined position of the substrate holding stage on the basis of the measured positional information.

* * * * *